US006980416B2

(12) United States Patent
Sakaguchi et al.

(10) Patent No.: US 6,980,416 B2
(45) Date of Patent: Dec. 27, 2005

(54) CAPACITOR, CIRCUIT BOARD WITH BUILT-IN CAPACITOR AND METHOD OF MANUFACTURING THE SAME

(75) Inventors: Hideaki Sakaguchi, Nagano (JP); Mitsutoshi Higashi, Nagano (JP); Takashi Mochizuki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/031,812

(22) Filed: Jan. 7, 2005

(65) Prior Publication Data

US 2005/0152098 A1 Jul. 14, 2005

(30) Foreign Application Priority Data

Jan. 9, 2004 (JP) ............................ 2004-004231

(51) Int. Cl.[7] ............................................ H01G 9/00

(52) U.S. Cl. ...................... 361/523; 361/527; 361/525; 29/25.03; 174/255

(58) Field of Search ................................ 361/523, 524, 361/504, 506, 525, 306.3, 311–312, 762–766, 361/811; 174/255–256

(56) References Cited

U.S. PATENT DOCUMENTS 6,421,227 B2 * 7/2002 Nitoh et al. ................ 361/523
6,678,144 B2 * 1/2004 Higashi et al. .......... 361/306.3

FOREIGN PATENT DOCUMENTS

JP 64-32621 2/1989

* cited by examiner

*Primary Examiner*—Anthony Dinkins
(74) *Attorney, Agent, or Firm*—Rankin, Hill, Porter & Clark LLP

(57) ABSTRACT

In a capacitor 10, a first electrode 21, a valve metal layer 22, a dielectric layer 23, a chemical polymerization film 24 (a first solid electrolytic layer), a conductive organic material layer 61, an electrolytic polymerization film 25 (a second solid electrolytic layer) and a second electrode 31 are provided on a base material 11, and the conductive organic material layer 61 is obtained by applying and caking a paste-like conductive organic material 60 onto the chemical polymerization film 24.

13 Claims, 5 Drawing Sheets

FIG. 1 ( I )

CAPACITOR, CIRCUIT BOARD WITH BUILT-IN CAPACITOR AND METHOD OF MANUFACTURING THE SAME

This application claims foreign priority based on Japanese Patent application No. 2004-4231, filed on Jan. 9, 2004, the contents of which is incorporated herein by reference in its entirety.

BACKGROUND OF THE INVENTION

1. Field of the Invention

The present invention relates to a capacitor using a solid electrolyte, a circuit board with built-in capacitor, and a method of manufacturing the capacitor and the circuit board with built-in capacitor.

2. Description of the Related Art

A capacitor using a solid electrolyte has a structure in which at least a first electrode, a dielectric layer, a solid electrolytic layer and a second electrode are provided in this order. In conventional way for manufacturing such a capacitor, the dielectric layer is formed on the surface of an anode, which turns out to be the first electrode, by using a method such as an anodic oxidation. Thereafter, the solid electrolytic layer is formed, and a carbon paste or a silver paste is applied onto the surface of the solid electrolytic layer, thereby forming a cathode to be the second electrode such as shown in Japanese Patent Publication JP-A-01-32621.

In the case in which a polypyrrole electrolytic polymerization film is used as the solid electrolytic layer, a polypyrrole layer is formed on the surface of the dielectric layer by a chemical polymerization and a conductivity is endowed to the surface of the dielectric layer, and then, an electrolytic polymerization is carried out.

However, a chemical polymerization film is deposited on the surface of a dielectric layer by a chemical reaction. For this reason, the thickness of a film is apt to be varied. Irregularity portions caused by such a unevenness in the thickness of the film remain on the surface of the electrolytic polymerization film after the formation of the electrolytic polymerization film. When a silver paste and a carbon paste are to be sequentially formed on the surface of the electrolytic polymerization film, therefore, the irregularity portions are eliminated by applying an Ag paste thickly. As a result, there is a problem in that the thickness of the capacitor is increased. Referring to the chemical polymerization film, moreover, a capacitor having a higher reliability can be obtained with an increase in the thickness of the film. Therefore, it is preferable that the chemical polymerization film should be formed thickly. For this purpose, it is necessary to repetitively carry out the chemical polymerization. As a result, there caused such a problem that the number of steps is increased, and furthermore, a unevenness in the thickness of the chemical polymerization film is further increased. In the case in which a capacitor is fabricated in a wiring board to constitute the circuit board with built-in capacitor, particularly, the thickness of the board is correspondingly increased if the thickness of the capacitor is increased, which is not preferable.

SUMMARY OF THE INVENTION

In consideration of the problems described above, it is an object of the invention to provide a method of manufacturing a capacitor which can absorb a unevenness in the thickness of a solid electrolytic layer to be formed on the surface of a dielectric layer, a method of manufacturing a circuit board with built-in capacitor, the capacitor, and the circuit board with built-in capacitor.

In order to solve the problems, the invention provides a method of manufacturing a capacitor comprising a dielectric layer forming step of forming a dielectric layer on a surface side of an electrode, a first solid electrolytic layer forming step of forming a first solid electrolytic layer on a surface of the dielectric layer, and a second electrode forming step of forming a second electrode to be opposed to the first electrode through the dielectric layer and the first solid electrolytic layer, wherein an organic material applying step of applying a paste-like conductive organic material onto a surface of the first solid electrolytic layer is carried out after the first solid electrolytic layer forming step prior to the second electrode forming step.

The capacitor thus constituted has such a structure that at least the first electrode, the dielectric layer, the first solid electrolytic layer and the second electrode are provided in this order and at least the conductive organic material layer obtained by caking the paste-like conductive organic material is provided between the first solid electrolytic layer and the second electrode.

In the invention, an anodic oxidation is carried out over a valve metal layer constituting at least the surface layer of the electrode in the formation of the dielectric layer, for example. The "valve metal" implies a metal capable of forming a dielectric by the anodic oxidation, for example, aluminum, tantalum, niobium, tungsten, vanadium, bismuth, titanium, zirconium, hafnium, their alloy or their compound. In the application, moreover, "a valve metal layer constituting at least the surface layer of the electrode" includes both a configuration in which the electrode is constituted by the valve metal layer and a configuration in which the valve metal layer is provided on the surface of the electrode.

In the invention, for example, a conductive polymer layer is formed as the first solid electrolytic layer on the surface of the dielectric layer by a chemical polymerization at the first solid electrolytic layer forming step.

In the invention, for example, a second solid electrolytic layer forming step of forming a second solid electrolytic layer constituted by a conductive polymer layer is carried out over a surface of the paste-like conductive organic material by an electrolytic polymerization after the conductive organic material applying step prior to the second electrode forming step, and the second electrode is then provided on a surface of the second solid electrolytic layer at the second electrode forming step.

In the invention, it is also possible to employ a method of bonding the second electrode to the first electrode side by using the paste-like conductive organic material as an adhesive agent at the second electrode forming step.

In this case, it is preferable that a second solid electrolytic layer should be formed at a side of a surface of the second electrode which is opposed to the first electrode prior to the second electrode forming step. For example, the second solid electrolytic layer is a conductive polymer layer formed on a surface of the second electrode by an electrolytic polymerization. In the case in which the manufacture is carried out by such a method, the capacitor comprises the second solid electrolytic layer between the conductive organic material layer and the second electrode.

Moreover, the dielectric layer and the second solid electrolytic layer may be provided in this order at a side of a surface of the second electrode which is opposed to the first electrode prior to the second electrode forming step. With this constitution, the capacitor has a non-polar structure including the dielectric layer between the second electrode and the second solid electrolytic layer. For the second solid electrolytic layer, for example, a conductive polymer layer is formed on the surface of the dielectric layer at the second electrode side by a chemical polymerization.

The capacitor to which the invention is applied can be constituted as a simple electronic component by itself, and furthermore, can be constituted as a capacitor in a circuit board with built-in capacitor which has the capacitor provided in the board. In the latter case, at least one of the first electrode and the second electrode is formed on an insulating base material for constituting the circuit board with built-in capacitor.

Advantage of the Invention

In the invention, the dielectric layer and the first solid electrolytic layer are formed on the surface of the first electrode in this order, and furthermore, the paste-like conductive organic material is applied onto the surface of the first solid electrolytic layer. When the first solid electrolytic layer is formed by a chemical polymerization film, therefore, irregularity portions caused by a unevenness in the thickness of the chemical polymerization film can be absorbed by the paste-like conductive organic material also in the case in which the thickness of the film becomes unevenness. Consequently, it is not necessary to thickly apply an Ag paste, thereby absorbing the irregularity portions. Thus, it is possible to reduce the thickness of the whole capacitor. Moreover, the paste-like conductive organic material is applied onto the surface of the chemical polymerization film. Also in the case in which the chemical polymerization film itself is thin, therefore, it is possible to obtain a capacitor having a high reliability. Furthermore, the thickness of the chemical polymerization film can be reduced. Consequently, it is possible to decrease the number of times of a chemical polymerization.

DESCRIPTION OF THE PREFERRED EMBODIMENTS

Embodiments of the present invention will be described herein below by reference to the drawings. Unless otherwise specifically defined in the specification, terms have their ordinary meaning as would be understood by those of ordinary skill in the art.

First Embodiment

Figure 1:
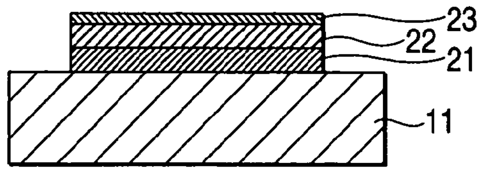
FIG. 1(A)-1(I) are sectional views showing steps in a method of manufacturing a polar capacitor and a circuit board with built-in capacitor according to a first embodiment of the invention.
Figure 1:
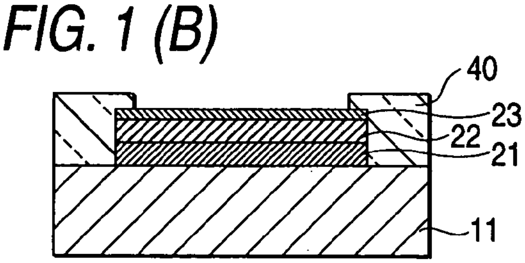
Figure 1:
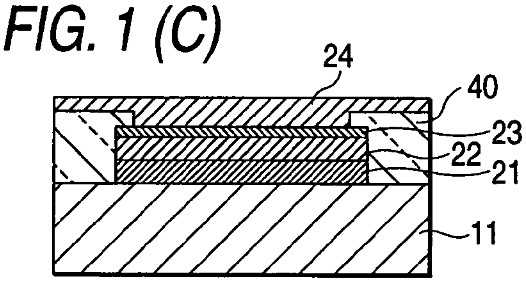
Figure 1:
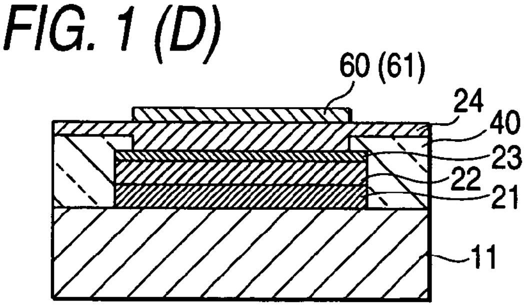
Figure 1:
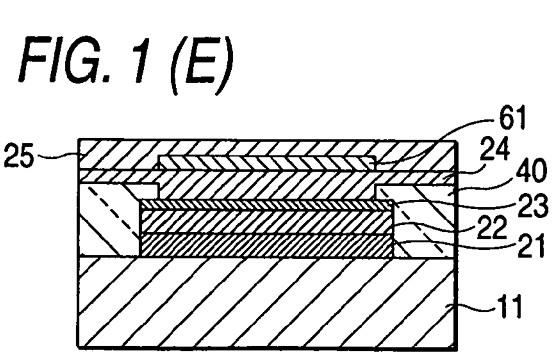
Figure 1:
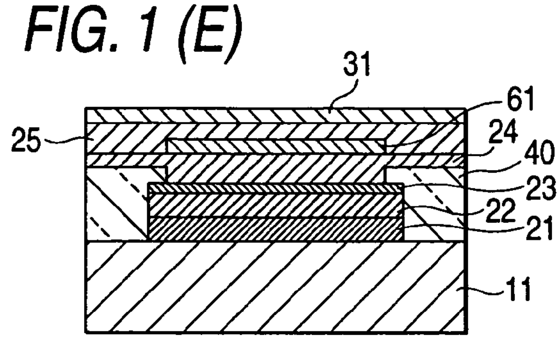
Figure 1:
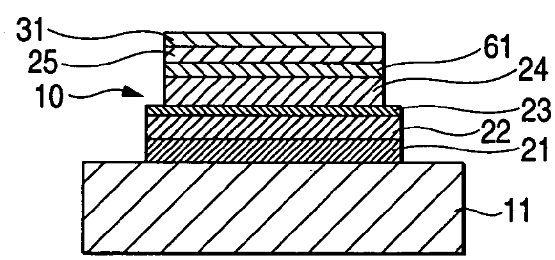
Figure 1:
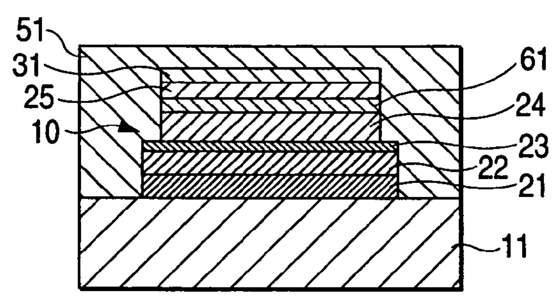
Figure 1:
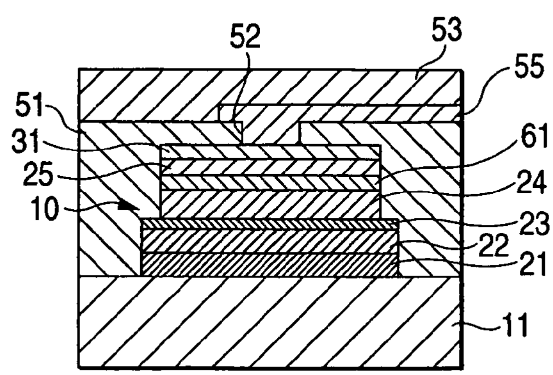

Referring to FIG. 1, the structure of a capacitor according to a first embodiment of the invention will be described in detail with an explanation of a method of manufacturing the same.

FIG. 1 is a sectional view showing steps in a method of manufacturing a polar capacitor and a circuit board with built-in capacitor according to the first embodiment of the invention. In the method of manufacturing a capacitor according to the embodiment, as shown in FIG. 1(A), a valve metal film 22 such as aluminum, tantalum, niobium, tungsten, vanadium, bismuth, titanium, zirconium, hafnium, their alloy or their compound (for example, niobium doped with oxygen) is formed on the surface of a first electrode 21 provided on a base material 11, and an anodic oxidation is then carried out to form a dielectric layer 23 constituted by an anodic oxide film (a dielectric layer forming step). In the embodiment, a tantalum film or a niobium film doped with oxygen is used as the valve metal film 22.

The base material 11 is an insulating board for forming a circuit board with built-in capacitor which will be described below, for example, and the first electrode 21 is a metal pattern such as copper (Cu) which is formed on the base material 11. In the case in which the first electrode 21 is formed by a valve metal, the anodic oxidation can be carried out over the first electrode 21 itself to form the dielectric layer 23. Therefore, it is possible to omit the formation of the valve metal film 22 shown in FIG. 1(A). Also in the case in which the dielectric layer 23 is to be formed by utilizing a semiconductor process such as a CVD method or a sputtering method, moreover, the formation of the valve metal film 22 shown in FIG. 1(A) can be omitted and the valve metal does not need to be used as the first electrode 21.

As shown in FIG. 1(B), next, a masking material layer 40 opening a region in which a solid electrolytic layer is to be provided is formed by a resist over the surface of the base material 11 and a chemical polymerization is carried out in this state, and a chemical polymerization film 24 (a first solid electrolytic layer) is formed over the whole surface side of the base material 11 as shown in FIG. 1(C) (a first solid electrolytic layer forming step). In order to form the chemical polymerization film 24, for example, a solution containing an oxidizing agent is caused to come in contact with the dielectric layer 23 to fix the oxidizing agent onto the surface of the dielectric layer 23, and thereafter, a solution containing a monomer or oligomer such as polypyrrole, polyaniline or polythiophene or a dopant, or a vapor is caused to come in contact with the dielectric layer 23. Alternatively, the oxidizing agent is added in the solution containing the monomer or oligomer such as polypyrrole, polyaniline or polythiophene, or the dopant so that the chemical polymerization film 24 is deposited on the surface of the dielectric layer 23.

As shown in FIG. 1(D), next, a paste-like conductive organic material 60 is applied onto the surface of the chemical polymerization film 24 by a printing method (an organic material applying step), and the paste-like conductive organic material 60 is then caked to form a conductive organic material layer 61. The paste-like conductive organic material 60 contains a conductive polymer such as polypyrrole or an organic semiconductor such as a TCNQ complex and exhibits a conductivity also after the caking.

As shown in FIG. 1(E), subsequently, an electrolytic polymerization film 25 (a second solid electrolytic layer) is formed on the surfaces of the conductive organic material layer 61 and the chemical polymerization film 24 (a second solid electrolytic layer forming step). In order to form such an electrolytic polymerization film 25, for example, an electrolytic polymerization is carried out by setting a stainless plate and a platinum plate to be counter electrodes in a solution containing a monomer or oligomer such as polypyrrole, polyaniline or polythiophene, or a dopant.

As shown in FIG. 1(F), then, a second electrode 31 formed by a Cu film is provided on the surface of the electrolytic polymerization film 25 by a sputtering method (a second electrode forming step).

When the masking material layer 40 is removed together with the chemical polymerization film 24 formed on the surface of the masking material layer 40, the conductive organic material layer 61, the electrolytic polymerization film 25 and the second electrode 31, thereafter, the chemical polymerization film 24, the conductive organic material layer 61, the electrolytic polymerization film 25 and the second electrode 31 can be caused to selectively remain in a predetermined region as shown in FIG. 1(G). Consequently, there is formed a capacitor 10 in which the first electrode 21, the valve metal layer 22, the dielectric layer 23, the chemical polymerization film 24, the conductive organic material layer 61, the electrolytic polymerization film 25 and the second electrode 31 are provided.

Figure 5:
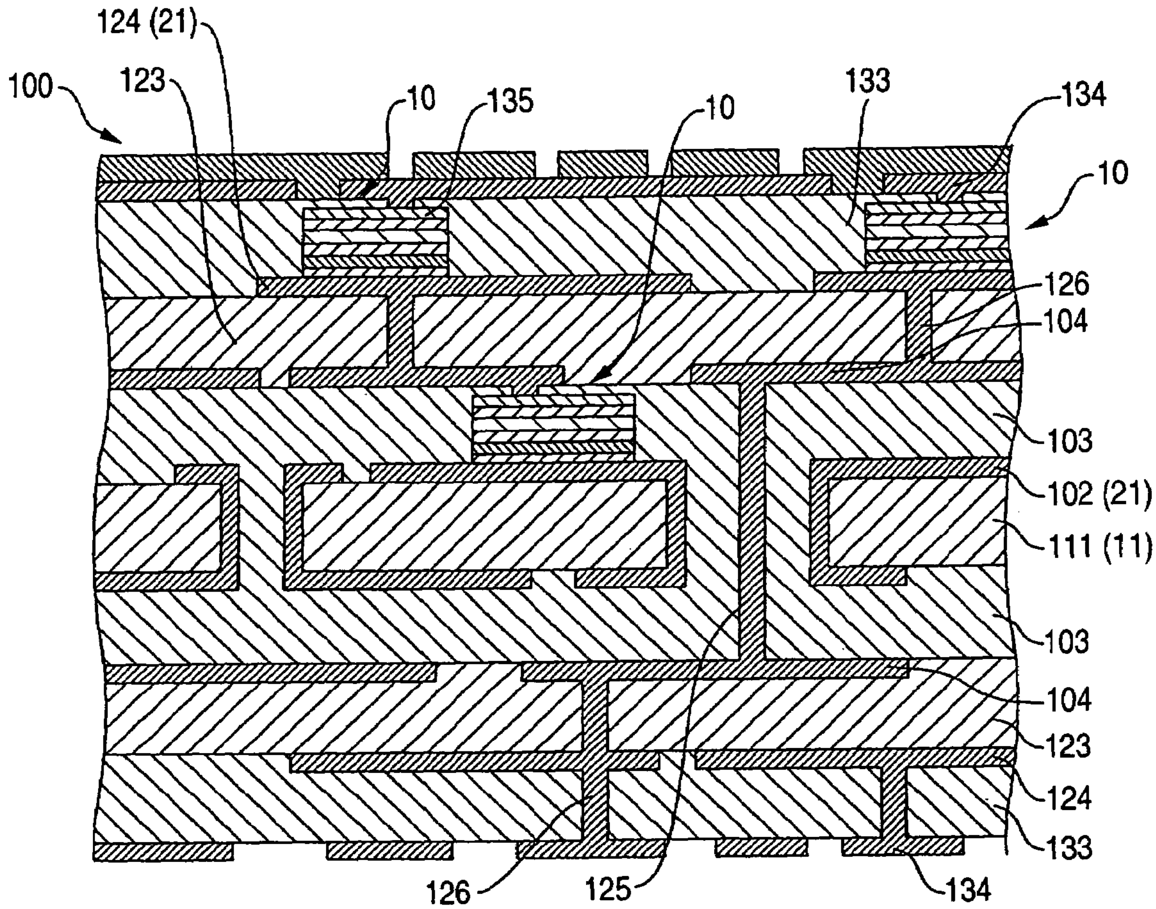
FIG. 5 is a sectional view showing a circuit board with built-in capacitor in which the capacitor applying the invention is provided.

In the case in which a circuit board with built-in capacitor which will be described below with reference to FIG. 5 is to be manufactured, next, a step of embedding the capacitor 10 in a wiring board is carried out. For this purpose, first of all, an epoxy resin is applied onto the whole surface of the base material 11 and is then caked to form an insulating layer 51 as shown in FIG. 1(H), and subsequently, a contact hole 52 to reach the second electrode 31 is formed on the insulating layer 51 by a method such as laser beam machining as shown in FIG. 1(I). Then, a metal layer formed by a Cu film is provided on the surface of the insulating layer 51 by a sputtering method, and thereafter, the metal layer is subjected to patterning by a photolithographic technique to form a wiring layer 55. Subsequently, the epoxy resin is applied onto the surface of the wiring layer 55 and is then caked to form an insulating layer 53.

Thus, the capacitor 10 having the first electrode 21, the valve metal layer 22, the dielectric layer 23, the chemical polymerization film 24 (the first solid electrolytic layer), the conductive organic material layer 61, the electrolytic polymerization film 25 (the second solid electrolytic layer) and the second electrode 31 provided on the base material 11 is manufactured, and furthermore, the wiring board having the capacitor 10 provided therein (the circuit board with built-in capacitor) is manufactured. In a method of manufacturing the capacitor 10 and the circuit board with built-in capacitor, according to the embodiment, the paste-like conductive organic material 60 is applied onto the surface of the chemical polymerization film 24. Also in the case in which the thickness of the chemical polymerization film 24 becomes unevenness, therefore, irregularity portions caused by the unevenness in the thickness of the film can be absorbed into the paste-like conductive organic material 60. For this reason, the surface of the electrolytic polymerization film 25 is flat. Accordingly, it is not necessary to apply a thick Ag paste, thereby absorbing the irregularity portions. Consequently, it is possible to reduce the thickness of the whole capacitor 10. Therefore, it is possible to manufacture a thin circuit board with built-in capacitor.

Moreover, the paste-like conductive organic material 60 is applied onto the surface of the chemical polymerization film 24. Also in the case in which the thickness of the first solid electrolytic layer 24 is small, therefore, the capacitor 10 having a high reliability can be obtained. Furthermore, the chemical polymerization film 24 may be thin. Consequently, it is possible to decrease the number of times of the chemical polymerization.

Second Embodiment

Figure 2:
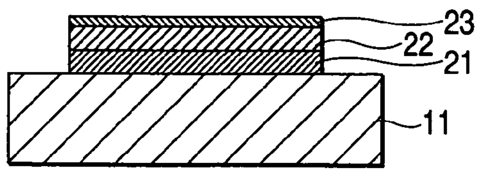
FIG. 2(A)-2(F) are sectional views showing steps in a method of manufacturing a polar capacitor according to a second embodiment of the invention.
Figure 2:
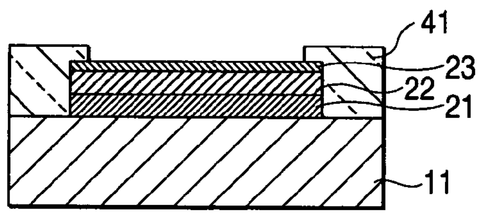
Figure 2:
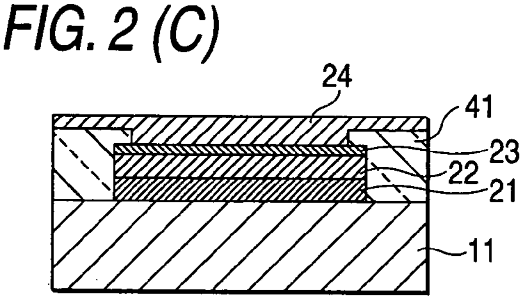
Figure 2:
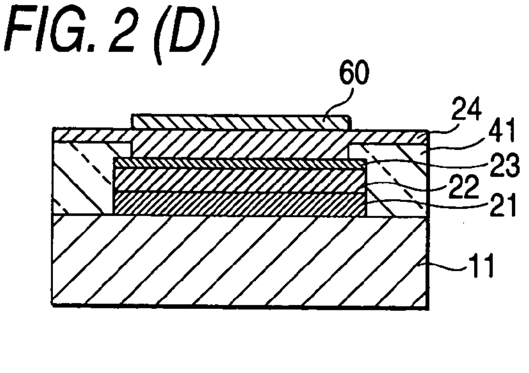
Figure 2:
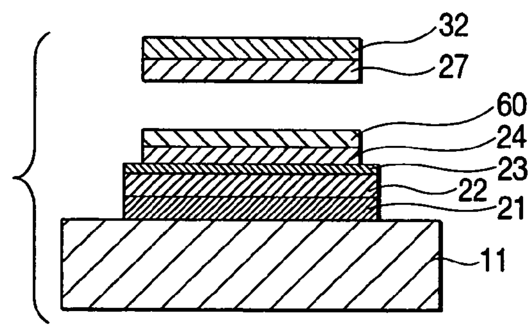
Figure 2:
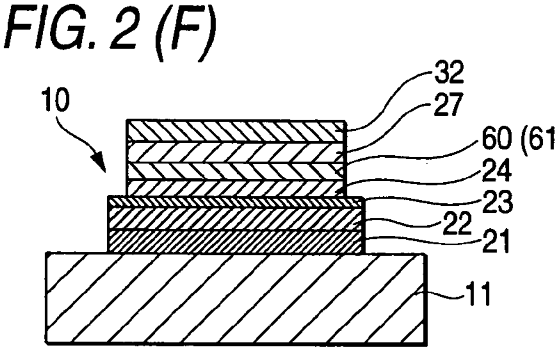

FIG. 2 is a sectional view showing steps in a method of manufacturing a polar capacitor according to a second embodiment of the invention. In the method of manufacturing a capacitor according to the embodiment, in the same manner as in the first embodiment, as shown in FIG. 2(A), a valve metal film 22 such as aluminum, tantalum, niobium, tungsten, vanadium, bismuth, titanium, zirconium, hafnium, their alloy or their compound (for example, niobium doped with oxygen) is formed on the surface of a first electrode 21 provided on a base material 11, and an anodic oxidation is then carried out to form a dielectric layer 23 constituted by an anodic oxide film (a dielectric layer forming step). In the embodiment, a tantalum film or a niobium film doped with oxygen is used as the valve metal film 22 in the same manner as in the first embodiment. The base material 11 is an insulating board for forming a circuit board with built-in capacitor which will be described below, and the first electrode 21 is a metal pattern such as copper (Cu) formed on the base material 11.

As shown in FIG. 2(B), next, a masking material layer 41 opening a region in which a chemical polymerization film is to be provided is formed by a resist over the surface of the base material 11 and a chemical polymerization is carried out in this state, and a chemical polymerization film 24 (a first solid electrolytic layer) is formed over the whole surface of the base material 11 as shown in FIG. 2(C) (a first solid electrolytic layer forming step).

As shown in FIG. 2(D), subsequently, a paste-like conductive organic material 60 is applied onto the surface of the chemical polymerization film 24 by a printing method (an organic material applying step). The paste-like conductive organic material 60 contains a conductive polymer such as polypyrrole or an organic semiconductor such as a TCNQ complex and has the function of an adhesive agent, and furthermore, exhibits a conductivity also after the caking.

When the masking material layer 41 is removed together with the chemical polymerization film 24 formed on the surface of the masking material layer 41 and the conductive organic material layer 60, then, the chemical polymerization film 24 and the paste-like conductive organic material 60 can be caused to selectively remain in a predetermined region as shown in FIG. 2(E).

On the other hand, an electrolytic polymerization film 27 (a second solid electrolytic layer) is directly formed on the surface of a second electrode 32 such as copper (Cu). In that case, the substrate of the electrolytic polymerization film 27 is the second electrode 32 having a conductivity. Even if a chemical polymerization film is not formed, therefore, the electrolytic polymerization film 27 formed by a conductive polymer such as polypyrrole, polyaniline or polythiophene can be directly formed on the surface of the second electrode 32. The second electrode 32 may be used in the state of a metal foil such as a copper foil or it is also possible to employ a structure in which the copper layer to be the second electrode 32 is formed on a base material such as a resin film (not shown).

As shown in FIG. 2(F), next, the surface of the first electrode 21 at a side on which the chemical polymerization film 24 and the paste-like conductive organic material 60 are formed and the surface of the second electrode 32 at a side on which the electrolytic polymerization film 27 is formed are bonded to each other by a method such as hot press (a second electrode forming step). Then, cooling and caking are carried out so that the paste-like conductive organic material 60 is changed to a conductive organic material layer 61.

Subsequently, an insulating layer and a wiring layer are formed as described with reference to FIGS. 1(H) and 1(I), which is not shown.

Also in the case in which there are manufactured a capacitor 10 including the first electrode 21, the valve metal layer 22, the dielectric layer 23, the chemical polymerization film 24 (the first solid electrolytic layer), the conductive organic material layer 61 obtained by caking the paste-like conductive organic material 60, the electrolytic polymerization film 27 (the second solid electrolytic layer) and the second electrode 32 provided on the base material 11, and the wiring circuit board with built-in capacitor, thus, the paste-like conductive organic material 60 is applied onto the surface of the chemical polymerization film 24. Therefore, irregularity portions caused by a unevenness in the thickness of the chemical polymerization film 24 can be absorbed into the paste-like conductive organic material 60. Accordingly, it is not necessary to apply a thick Ag paste, thereby absorbing the irregularity portions. Consequently, it is possible to reduce the thickness of the whole capacitor 10. Moreover, the paste-like conductive organic material 60 is applied onto the surface of the chemical polymerization film 24. Also in the case in which the thickness of the first solid electrolytic layer 24 is small, therefore, the capacitor 10 having a high reliability can be obtained. Furthermore, the chemical polymerization film 24 may be thin. Consequently, it is possible to decrease the number of times of the chemical polymerization.

Third Embodiment

Figure 3:
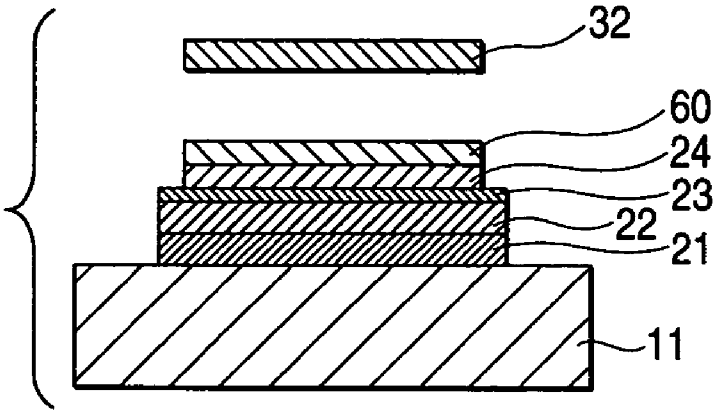
FIG. 3(A)-3(B) are sectional views showing steps in a method of manufacturing a polar capacitor according to a third embodiment of the invention.
Figure 3:
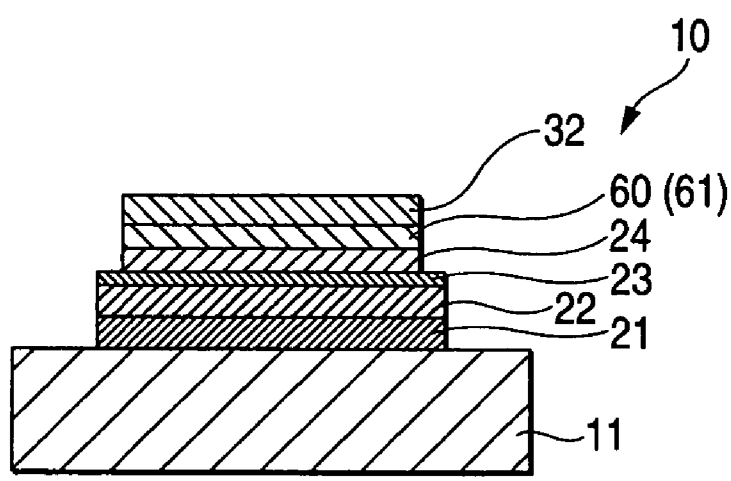

FIG. 3 is a sectional view showing steps in a method of manufacturing a polar capacitor according to a third embodiment of the invention. In the method of manufacturing a capacitor according to the embodiment, the steps shown in FIGS. 2(A) to 2(D) described in the second embodiment are carried out. Consequently, a valve metal layer 22, a dielectric layer 23, a chemical polymerization film 24 (a first solid electrolytic layer) and a paste-like conductive organic material 60 are provided on the surface of a first electrode 21 formed on a base material 11 as shown in FIG. 3(A).

Then, a second electrode 32 such as copper (Cu) and the surface of the first electrode 21 at a side on which the chemical polymerization film 24 and the paste-like conductive organic material 60 are formed are bonded to each other by a method such as hot press.

As shown in FIG. 3(B), thus, there is manufactured a capacitor 10 in which the first electrode 21, the valve metal layer 22, the dielectric layer 23, the chemical polymerization film 24 (the first solid electrolytic layer), a conductive organic material layer 61 obtained by caking the paste-like conductive organic material 60, and the second electrode 31 are provided on the base material 11. Also in such a structure, the paste-like conductive organic material 60 is applied onto the surface of the chemical polymerization film 24. Therefore, irregularity portions caused by a unevenness in the thickness of the chemical polymerization film 24 can be absorbed into the paste-like conductive organic material 60. Moreover, the paste-like conductive organic material 60 is applied onto the surface of the chemical polymerization film 24. Also in the case in which the electrolytic polymerization film is omitted, therefore, the capacitor 10 having a high reliability can be obtained. Furthermore, the chemical polymerization film 24 may be thin. Consequently, it is possible to decrease the number of times of the chemical polymerization.

Fourth Embodiment

Figure 4:
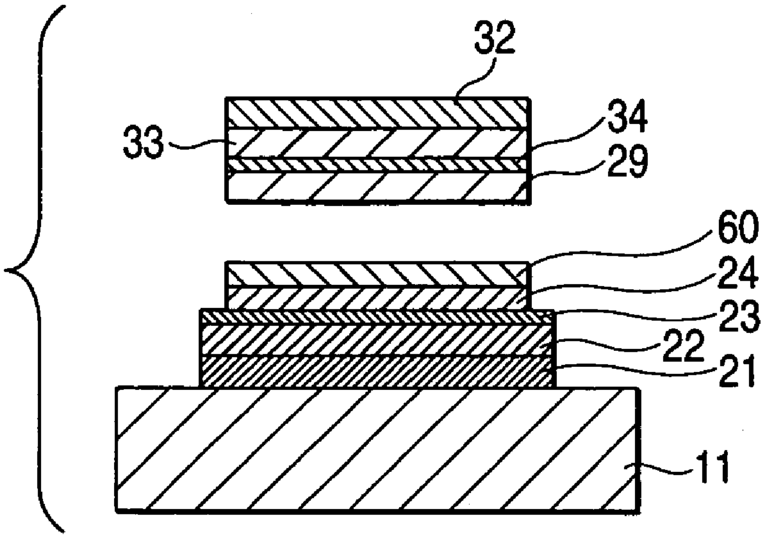
FIG. 4(A)-4(B) are sectional views showing steps in a method of manufacturing a non-polar capacitor according to a fourth embodiment of the invention.
Figure 4:
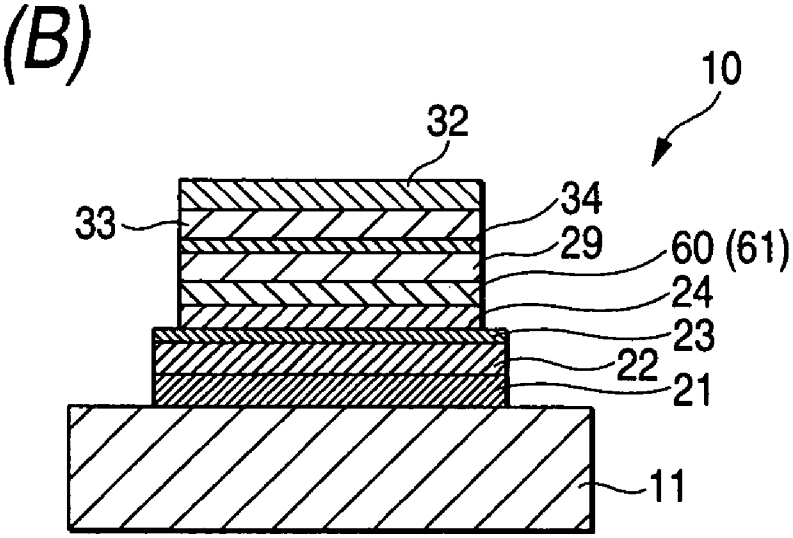

FIG. 4 is a sectional view showing steps in a method of manufacturing a non-polar capacitor according to a fourth embodiment of the invention. Also in the method of manufacturing a capacitor according to the embodiment, the steps shown in FIGS. 2(A) to 2(D) described in the second embodiment are carried out. Consequently, a valve metal layer 22, a dielectric layer 23, a chemical polymerization film 24 (a first solid electrolytic layer) and a paste-like conductive organic material 60 are provided on the surface of a first electrode 21 formed on a base material 11 as shown in FIG. 4(A).

Moreover, a valve metal film 33 is formed on the surface of a second electrode 32 such as copper (Cu) and an anodic oxidation is then carried out to form a dielectric layer 34 constituted by an anodic oxide film. Moreover, a chemical polymerization film 29 to be a second solid electrolytic layer is formed on the surface of the dielectric layer 34.

As shown in FIG. 4(B), subsequently, the surface of the first electrode 21 at a side on which the chemical polymerization film 24 and the paste-like conductive organic material 60 are formed and the surface of the second electrode 32 at a side on which the chemical polymerization film 29 is formed are bonded to each other through the paste-like conductive organic material 60 (a conductive organic material layer 61) so that a non-polar (non-polar type) capacitor 10 is manufactured.

As for other Embodiment, while the conductive polymer such as polypyrrole, polyaniline or polythiophene has been used for the solid electrolytic layers 24, 25, 27 and 29 in the embodiments, it is also possible to use a TCNQ complex. In case of the TCNQ complex, for example, it is preferable that heating and melting should be carried out in a state in which the TCNQ complex is disposed on a predetermined region, and cooling and caking should be then performed to form a solid electrolytic layer. Moreover, the invention may be applied to a capacitor using, for a solid electrolyte, manganese dioxide obtained by sintering a manganese nitrate solution in place of such an organic solid electrolyte or together with the organic solid electrolyte.

EXAMPLE OF APPLICATION TO BOARD HAVING INTERNAL CAPACITOR

FIG. 5 is a sectional view showing a circuit board with built-in capacitor in which a capacitor applying the invention is provided in a wiring board. In FIG. 5, a board 100 having an internal capacitor according to the embodiment is a circuit board having a so-called built-up structure. In the board 100 having an internal capacitor, the upper and lower surfaces of a core substrate 111 formed by a silicon substrate, a ceramic substrate, a resin substrate or a glass-epoxy substrate are provided with a plurality of wiring layers 102, 104, 124 and 134 formed by copper layers. These wiring layers are isolated from each other through insulating films 103, 123 and 133. In the embodiment, a part of the wiring layers 102 and 124 is utilized as the first electrode of the capacitor 10.

In the board 100 having an internal capacitor, three capacitors 10 are provided in total at the upper surface side of the core substrate 111, and all of these capacitors 10 are shown to be manufactured by the method according to the first embodiment, for example. More specifically, all of the three capacitors 10 have a structure in which the wiring layers 102 and 124 to be the first electrode 21, the valve metal film 22, the dielectric layer 23, the chemical polymerization film 24, the conductive organic material layer 61, the electrolytic polymerization film 25 and the second electrode 31 are provided as shown in FIG. 1(I). Moreover, the capacitor 10 and the wiring layers 102, 104, 124 and 134 are mutually connected through a through hole 125 formed on the core substrate 11 and the insulating films 103, 123 and 133 by a method such as laser beam machining and a conductive metal filled in a via 126.

In the invention, a dielectric layer and a first solid electrolytic layer are formed on the surface of a first electrode in this order, and furthermore, a paste-like conductive organic material is applied on to the surface of the first solid electrolytic layer. Also in the case in which the thickness of a chemical polymerization film becomes unevenness when the first solid electrolytic layer is formed by the chemical polymerization film, irregularity portions caused by the unevenness in the thickness of the film can be absorbed into the paste-like conductive organic material. For this reason, it is not necessary to thickly apply an Ag paste, thereby absorbing the irregularity portions. Consequently, it is possible to reduce the thickness of a whole capacitor. Moreover, the paste-like conductive organic material is applied onto the surface of the chemical polymerization film. Also in the case in which the chemical polymerization film itself is thin, therefore, a capacitor having a high reliability can be obtained. Furthermore, the chemical polymerization film may be thin. Thus, it is possible to decrease the number of times of a chemical polymerization.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A method of manufacturing the capacitor comprising at least:

a dielectric layer forming step of forming a dielectric layer on the surface side of a first electrode;

a first solid electrolytic layer forming step of forming the first solid electrolytic layer on a surface of the dielectric layer, and a second electrode forming step of forming a second electrode to be opposed to the first electrode through the dielectric layer and the first solid electrolytic layer, wherein an organic material applying step of applying a paste-like conductive organic material onto a surface of the first solid electrolytic layer is carried out after the first solid electrolytic layer forming step prior to the second electrode forming step.

2. The method of manufacturing a capacitor according to claim 1, wherein a conductive polymer layer is formed as the first solid electrolytic layer on the surface of the dielectric layer by a chemical polymerization at the first solid electrolytic layer forming step.

3. The method of manufacturing a capacitor according to claim 1, wherein a second solid electrolytic layer forming step of forming the second solid electrolytic layer constituted by a conductive polymer layer is carried out over a surface of the conductive organic material by an electrolytic polymerization after the conductive organic material applying step prior to the second electrode forming step, and the second electrode is then provided on a surface of the second solid electrolytic layer at the second electrode forming step.

4. The method of manufacturing a capacitor according to claim 1, wherein the second electrode is bonded to the first electrode side by using the paste-like conductive organic material as an adhesive agent at the second electrode forming step.

5. The method of manufacturing a capacitor according to claim 4, wherein a second solid electrolytic layer is formed at a side of a surface of the second electrode which is opposed to the first electrode prior to the second electrode forming step.

6. The method of manufacturing a capacitor according to claim 5, wherein the second solid electrolytic layer is a conductive polymer layer formed on a surface of the second electrode by an electrolytic polymerization.

7. The method of manufacturing a capacitor according to claim 4, wherein a second dielectric layer and a second solid electrolytic layer are provided at a side of a surface of the second electrode which is opposed to the first electrode prior to the second electrode forming step.

8. The method of manufacturing a capacitor according to claim 7, wherein a conductive polymer layer is formed as the second solid electrolytic layer on the surface of the second dielectric layer at the second electrode side by a chemical polymerization.

9. A method of manufacturing a circuit board with built-in capacitor using the manufacturing method according to claim 1, wherein the first electrode is formed on an insulating base material for constituting the circuit board with built-in capacitor.

10. A capacitor in which at least a first electrode, a dielectric layer, a first solid electrolytic layer and a second electrode are provided in this order, wherein at least a conductive organic material layer obtained by caking a paste-like conductive organic material is provided between the first solid electrolytic layer and the second electrode.

11. The capacitor according to claim 10, wherein a second solid electrolytic layer is provided between the conductive organic material layer and the second electrode.

12. The capacitor according to claim 11, wherein a second dielectric layer is provided between the second electrode and the second solid electrolytic layer.

13. A circuit board with built-in capacitor in which the capacitor according to claim 10 is provided, wherein the first electrode is formed on an insulating base material for constituting the circuit board with built-in capacitor.

* * * * *

UNITED STATES PATENT AND TRADEMARK OFFICE

CERTIFICATE OF CORRECTION

PATENT NO. : 6,980,416 B2
DATED : December 27, 2005
INVENTOR(S) : Sakaguchi et al.

It is certified that error appears in the above-identified patent and that said Letters Patent is hereby corrected as shown below:

Column 9,
Lines 38 and 43, delete “a” (second occurrance) and insert -- the --.
Line 39, delete “the” and insert -- a --.

Signed and Sealed this

Fourteenth Day of February, 2006

JON W. DUDAS
*Director of the United States Patent and Trademark Office*